United States Patent
Kang et al.

(10) Patent No.: US 11,307,249 B1
(45) Date of Patent: Apr. 19, 2022

(54) METHOD FOR CHARACTERIZING RESISTANCE STATE OF PROGRAMMABLE ELEMENT

(71) Applicant: NANYA TECHNOLOGY CORPORATION, New Taipei (TW)

(72) Inventors: Ting-Cih Kang, New Taipei (TW); Wei-Zhong Li, Taoyuan (TW); Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/136,777

(22) Filed: Dec. 29, 2020

(51) Int. Cl.
*G01R 31/28* (2006.01)
*G01R 27/08* (2006.01)
*G01R 31/30* (2006.01)

(52) U.S. Cl.
CPC ......... *G01R 31/2896* (2013.01); *G01R 27/08* (2013.01); *G01R 31/2874* (2013.01); *G01R 31/2879* (2013.01); *G01R 31/3004* (2013.01)

(58) Field of Classification Search
CPC .......... G01R 31/2831; G01R 31/31702; G01R 31/26; G01R 31/2642; G01R 31/2648
See application file for complete search history.

(56) References Cited

U.S. PATENT DOCUMENTS

| 10,983,162 B2 * | 4/2021 | Iwaki | G01R 31/308 |
| 2016/0373720 A1 | 12/2016 | Shepherd | |
| 2021/0407591 A1 * | 12/2021 | Amato | G11C 13/0023 |

* cited by examiner

*Primary Examiner* — Tung X Nguyen
(74) *Attorney, Agent, or Firm* — Muncy, Geissler, Olds & Lowe, P.C.

(57) ABSTRACT

The present application discloses a method for characterizing a resistance state of a programmable element of an integrated circuit. The method includes the steps of setting a first programming voltage of a first polarity to program the programmable element of the integrated circuit, setting a first read voltage of the first polarity to the integrated circuit at a first temperature to obtain a first read current, and a first resistance is derived from the first read current, setting the first read voltage of the first polarity to the integrated circuit at a second temperature to obtain a second read current, the second temperature is at least 50° C. higher than the first temperature, and a second resistance is derived from the second read current, and comparing the first resistance and the second resistance to characterize the resistance state of the programmable element.

20 Claims, 13 Drawing Sheets

METHOD FOR CHARACTERIZING RESISTANCE STATE OF PROGRAMMABLE ELEMENT

TECHNICAL FIELD

The present disclosure relates to a method for characterizing a resistance state of a programmable element.

DISCUSSION OF THE BACKGROUND

A resistance state of an electronic element strongly dominates its performance. A facile method for characterization the resistance state of an electronic element is urgently needed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a method for characterizing a resistance state of a programmable element of an integrated circuit, including the step of setting a first programming voltage of a first polarity to program the programmable element of the integrated circuit, setting a first read voltage of the first polarity to the integrated circuit at a first temperature to obtain a first read current, and a first resistance is derived from the first read current, setting the first read voltage of the first polarity to the integrated circuit at a second temperature to obtain a second read current, the second temperature is at least 50° C. higher than the first temperature, and a second resistance is derived from the second read current, and comparing the first resistance and the second resistance to characterize the resistance state of the programmable element.

In some embodiments, the first temperature is between about 0° C. and about 40° C.

In some embodiments, the second temperature is between about 90° C. and 110° C.

In some embodiments, the step of setting the first programming voltage of the first polarity to program the programmable element of the integrated circuit is conducted at a temperature between about 90° C. and 110° C.

In some embodiments, the first polarity is positive with respect to ground potential.

In some embodiments, the programmable element is electrically coupled between a first terminal and a voltage node of the integrated circuit and the first programming voltage is applied to the first terminal.

In some embodiments, the voltage node includes ground potential.

In some embodiments, the integrated circuit includes a protection transistor electrically coupled between the programmable element and the voltage node.

In some embodiments, the integrated circuit includes a selection transistor electrically coupled between the protection transistor and the voltage node.

In some embodiments, the programmable element includes a top electrode electrically coupled to the first terminal and a bottom electrode electrically coupled to the voltage node and separated from the top electrode by a middle insulation layer.

In some embodiments, the programmable element includes a programming gate electrode electrically coupled to the first terminal, a first channel region separated from the programming gate electrode by a first insulation layer, and a first impurity region and a second impurity region respectively adjoined to two sides of the first channel region, and the first impurity region is electrically coupled to the voltage node.

In some embodiments, the second impurity region is electrically float.

In some embodiments, the integrated circuit includes a first conductive line electrically coupled to the voltage node and a first bias voltage of a second polarity is applied to the first conductive line.

In some embodiments, the second polarity is negative with respect to ground potential.

In some embodiments, the first bias voltage is between about −1.0 volts and about −2.0 volts.

In some embodiments, the programming voltage is between about +5.0 volts and about +10.0 volts.

In some embodiments, the selection transistor includes a third impurity region electrically coupled to the protection transistor, a fourth impurity region electrically coupled to the voltage node and separated from the third impurity region by a second channel region, a selection gate electrode over the second channel region with a second insulation layer interposed therebetween.

In some embodiments, the selection transistor includes a first light-impurity region adjacent to the third impurity region and a second light-impurity region adjacent to the fourth impurity region and the second channel region is between the first light-impurity region and the second light-impurity region.

Another aspect of the present disclosure provides a method for determining a minimum programming current of programming a programmable element of an integrated circuit, including the step of setting a first programming voltage to program the programmable element of the integrated circuit device and obtain a first programming current, setting a first read voltage to the integrated circuit at a first temperature to obtain a first read current, and a first resistance is derived from the first read current, setting the first read voltage to the integrated circuit at a second temperature to obtain a second read current, the second temperature is at least 50° C. higher than the first temperature, and a second resistance is derived from the second read current, comparing the first resistance and the second resistance to characterize a resistance state of the programmable element is ohmic state, and referring the first programming current as the minimum programming current.

Another aspect of the present disclosure provides a method for determining a minimum programming current of programming a programmable element of an integrated circuit, including the step of setting a first programming voltage to program the programmable element of the integrated circuit device and obtain a first programming current, setting a first read voltage to the integrated circuit at a first temperature to obtain a first read current, and a first resistance is derived from the first read current, setting the first read voltage to the integrated circuit at a second temperature to obtain a second read current, the second temperature is at least 50° C. higher than the first temperature, and a second resistance is derived from the second read current, comparing the first resistance and the second resistance to characterize a resistance state of the programmable element is hopping state or surface scattering state, tuning the integrated circuit and setting the first programming voltage to reprogram the programmable element to obtain a post-tuning programming current, setting the first read voltage to the integrated circuit at the first temperature to obtain a first post-tuning read current, and a first post-tuning resistance is derived from the first post-tuning read current, setting the first read voltage to the integrated circuit at the second temperature to obtain a second post-tuning read current, and a second post-tuning resistance is derived from the second post-tuning read current, comparing the first post-tuning resistance and the second post-tuning resistance to characterize the resistance state of the programmable element is ohmic state, referring the post-tuning programming current as the minimum programming current, and repeating the step of tuning the integrated circuit and setting the first programming voltage to the step of comparing the first post-tuning resistance and the second post-tuning resistance if the resistance state of the programmable element is characterized as hopping state or surface scattering state at the step of comparing the first post-tuning resistance and the second post-tuning resistance.

Due to the design of the method in accordance with one embodiment of the present disclosure, the resistance state of the programmable element can be characterized readily. Hence, the programmable elements which are not meet the specification criteria (i.e., in hopping state or surface scattering state) can be easily screened out and according treatment such as reprogram can be immediately applied. As a result, the device fabrication time using the method for characterization of the resistance state of the programmable element may be shorted.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
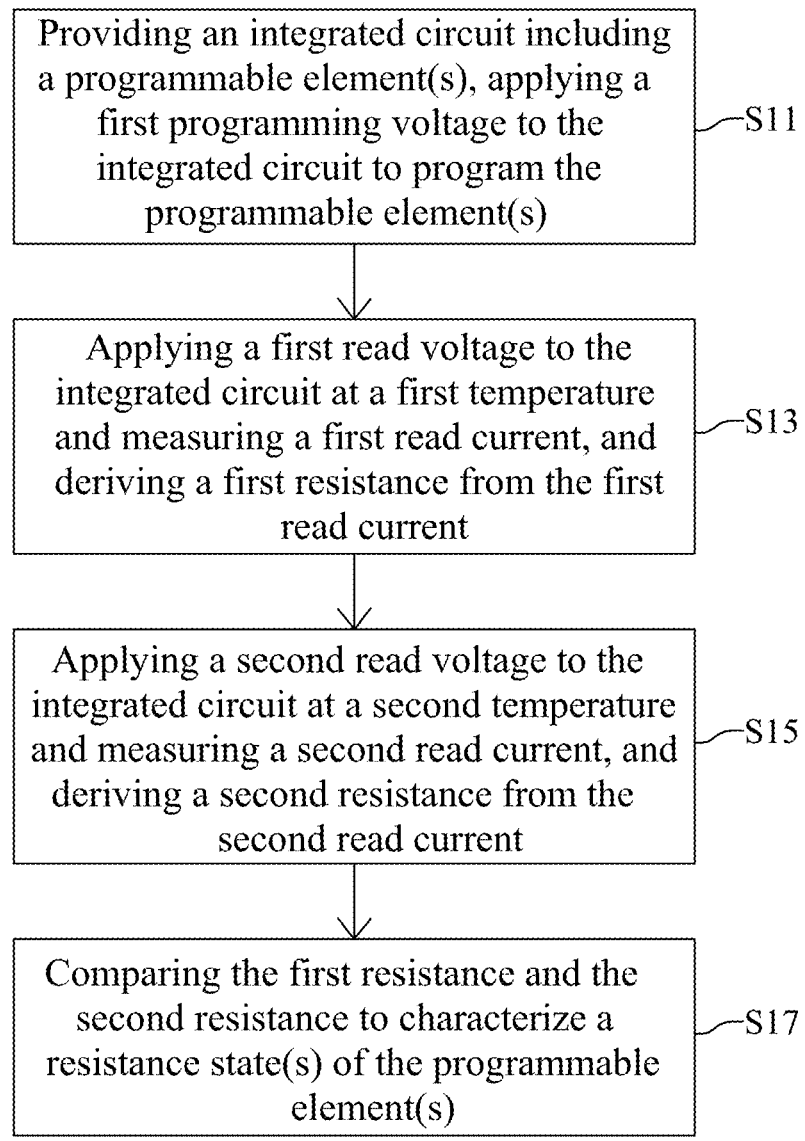
FIG. 1 illustrates, in a flowchart diagram form, a method for characterizing programmable elements of an integrated circuit in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

It should be noted that, in the description of the present disclosure, above (or up) corresponds to the direction of the arrow of the direction Z, and below (or down) corresponds to the opposite direction of the arrow of the direction Z.

Figure 2:
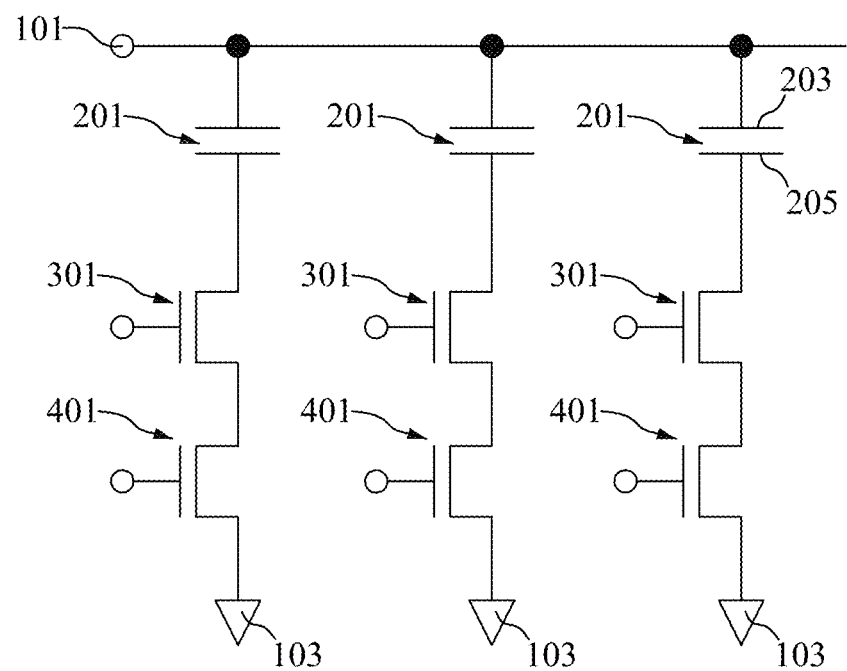
FIG. 2 illustrates, in a schematic circuit diagram, the integrated circuit in accordance with one embodiment of the present disclosure.
Figure 3:
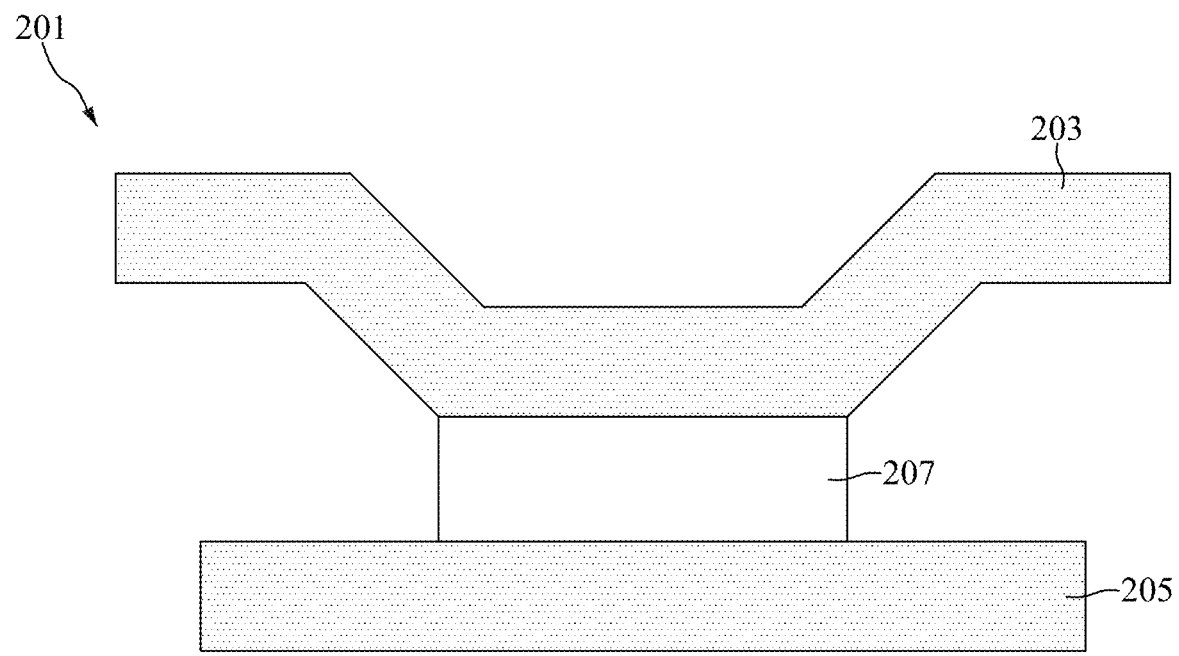
FIG. 3 illustrates, in a schematic cross-sectional view diagram, one of the programmable elements of the integrated circuit in accordance with one embodiment of the present disclosure.

FIG. 1 illustrates, in a flowchart diagram form, a method 10 for characterizing programmable elements 201 of an integrated circuit in accordance with one embodiment of the present disclosure. FIG. 2 illustrates, in a schematic circuit diagram, the integrated circuit in accordance with one embodiment of the present disclosure. FIG. 3 illustrates, in a schematic cross-sectional view diagram, one of the programmable elements 201 of the integrated circuit in accordance with one embodiment of the present disclosure.

With reference to FIGS. 1 to 3, at step S11, the integrated circuit including programmable elements 201 may be provided, a first programming voltage may be applied to the integrated circuit to program the programmable elements 201, and a first programming current may be obtained.

With reference to FIG. 2, the integrated circuit may include a first terminal 101, voltage nodes 103, the programmable elements 201, protection transistors 301, and selection transistors 401.

With reference to FIG. 2, in some embodiments, the first terminal 101 may be electrically coupled to the programmable elements 201. The programmable elements 201 may be connected in parallel to form an array. The protection transistors 301 may be connected in parallel. The selection transistors 401 may be connected in parallel. For convenience of description, only one programmable element 201, one protection transistor 301, and one selection transistor 401 are described. The programmable elements 201 may be electrically coupled between the first terminal 101 and a corresponding one of the voltage nodes 103. The protection transistor 301 may be electrically coupled between the programmable element 201 and the corresponding one of the voltage nodes 103. The selection transistor 401 may be electrically coupled between the protection transistor 301 and the corresponding one of the voltage nodes 103. In other words, the programmable element 201 may be electrically coupled between the first terminal 101 and the protection transistor 301 and the protection transistor 301 may be electrically coupled between the programmable element 201 and the selection transistor 401.

It should be noted that three programmable elements 201 shown in FIG. 2 are just for exemplary purpose. The number of the programmable elements 201 may be greater than or less than three. For example, the number of the programmable elements 201 can be four, five, or more.

In some embodiments, the first terminal 101 may be an external pin which the integrated circuit is associated. In some embodiments, the integrated circuit may include multiple first terminals 101. Each one of the first terminals 101 may be electrically coupled to a corresponding programmable element 201.

With reference to FIG. 3, in some embodiments, the programmable element 201 may have a capacitor-like structure and may include a top electrode 203, a bottom electrode 205, and a middle insulation layer 207. The top electrode 203 and the bottom electrode 205 may be separated by the middle insulation layer 207 interposed therebetween. The top electrode 203 may be electrically coupled to the first terminal 101. The bottom electrode 205 may be electrically coupled to the protection transistor 301 or the voltage node 103.

The top electrode 203 and the bottom electrode 205 may be formed of, for example, polycrystalline silicon, doped polycrystalline silicon, polycrystalline silicon germanium, doped polycrystalline silicon germanium, or a metallic material (e.g., titanium, tantalum, tungsten, copper, or aluminum). The middle insulation layer 207 may be formed of, for example, oxides, nitrides, oxynitrides, silicates (e.g., metal silicates), aluminates, titanates, nitrides, high-k materials, or any combination thereof. The high-k materials may have a k value greater than about 7.0 and may be a metal oxide or a silicate of Hf, Al, Zr, La, Mg, Ba, Ti, Pb, or a combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials may further include dopants such as, for example, lanthanum and aluminum. In some embodiments, the middle insulation layer 207 may have a thickness between about 15 angstroms and about 55 angstroms.

In a programming procedure, the first programming voltage may be applied to the integrated circuit through the first terminal 101 and the voltage node 103 may be set to ground potential. The middle insulation layer 207 may be stressed under the first programming voltage. As a result, the middle insulation layer 207 may be ruptured to form a contiguous path connecting the top electrode 203 and the bottom electrode 205. After the initial rupture of the middle insulation layer 207, the programming voltage is applied for a specified time interval to allow current to flow through the programmable element 201 thereby reducing the resistance of the contiguous path through the programmable element 201. This specified time interval may be referred to as a soak interval. In some embodiments, the soak interval may be between about 10 microseconds and about 600 microseconds, between about 10 microseconds and about 50 microseconds, or between about 10 microseconds and about 20 microseconds.

In some embodiments, the first programming voltage may have a first polarity, which is positive with respect to ground potential. In some embodiments, the first programming voltage may be generated by a charge-pump circuit. In some embodiments, the first programming voltage may be between about +6.0 volts and about +10.5 volts, between about +6.0 volts and about +8.5 volts, or between about +6.0 volts and about +6.5 volts.

The protection transistor 301 may provide voltage isolation due to the relatively high programming voltage required to program the programmable element 201 thereby protecting other circuit elements from damage (e.g., the selection transistor 401). In some embodiments, a first operation voltage between the first programming voltage and ground potential may be applied to the protection transistor 301 in the programming procedure. In some embodiments, the first operation voltage may be between about +0.5 volts and about +2.0 volts. In some embodiments, ground potential may be set to some of the protection transistors 301. The programmable element 201 electrically coupled to the protection transistor 301 with ground potential may not be programmed in the programming procedure.

In some embodiments, a second operation voltage between the first programming voltage and ground potential may be applied to the selection transistor 401 in the programming procedure. In some embodiments, the second operation voltage may be between about +0.5 volts and about +2.0 volts. In some embodiments, ground potential may be set to some of the selection transistor 401. The programmable element 201 electrically coupled to the selection transistor 401 with ground potential may not be programmed in the programming procedure.

In some embodiments, some of the voltage nodes 103 may be set to a voltage greater than ground potential. The programmable elements 201 electrically coupled to the voltage nodes 103 with non-ground potential may not be programmed in the programming procedure due to the voltage difference is not greater than the breakdown voltage of the programmable elements 201.

In some embodiments, the programmable elements 201 may be programmed all together during a single programming procedure. In some embodiments, only one programmable element 201 may be programmed during a single programming procedure. In some embodiments, some programmable elements 201 may be programmed during a single programming procedure. In some embodiments, the programming procedure may be conducted at a temperature between about 90° C. and about 110° C.

With reference to FIGS. 1 and 2, at step S13, a first read voltage may be applied to the integrated circuit at a first temperature and a first read current may be measured. A first resistance $R_{LT}$ may be derived from the first read current.

With reference to FIG. 2, after the programming procedure, the first read voltage may be applied through the first terminal 101 and the voltage node 103 may be set to ground potential in a first read procedure. The first read voltage may have the first polarity. The first read voltage may be between about +0.5 volts and about +2.0 volts, between about +1.0 volts and about +2.0 volts, between about +1.0 volts and about +1.5 volts, or between about +1.0 volts and about +1.2 volts. The first operation voltage for the protection transistor 301 and the second operation voltage for the selection transistor 401 may be set to about +1.5 volts. The first temperature may be between about 0° C. and about 40° C. The first read current may be measured in the first read procedure. The first resistance $R_{LT}$ may be derived from the first read current.

With reference to FIGS. 1 and 2, at step S15, a second read voltage may be applied to the integrated circuit at a second temperature and a second read current may be measured. A second resistance $R_{HT}$ may be derived from the second read current.

With reference to FIG. 2, after the first read procedure, the second read voltage may be applied through the first terminal 101 and the voltage node 103 may be set to ground potential in a second read procedure. The second read voltage may have the first polarity. The second read voltage may be between about +0.5 volts and about +2.0 volts, between about +1.0 volts and about +2.0 volts, between about +1.0 volts and about +1.5 volts, or between about +1.0 volts and about +1.2 volts. The first operation voltage for the protection transistor 301 and the second operation voltage for the selection transistor 401 may be set to about +1.5 volts. The second temperature may be between about 90° C. and about 110° C. The second read current may be measured in the second read procedure. The second resistance $R_{HT}$ may be derived from the second read current.

Figure 4:
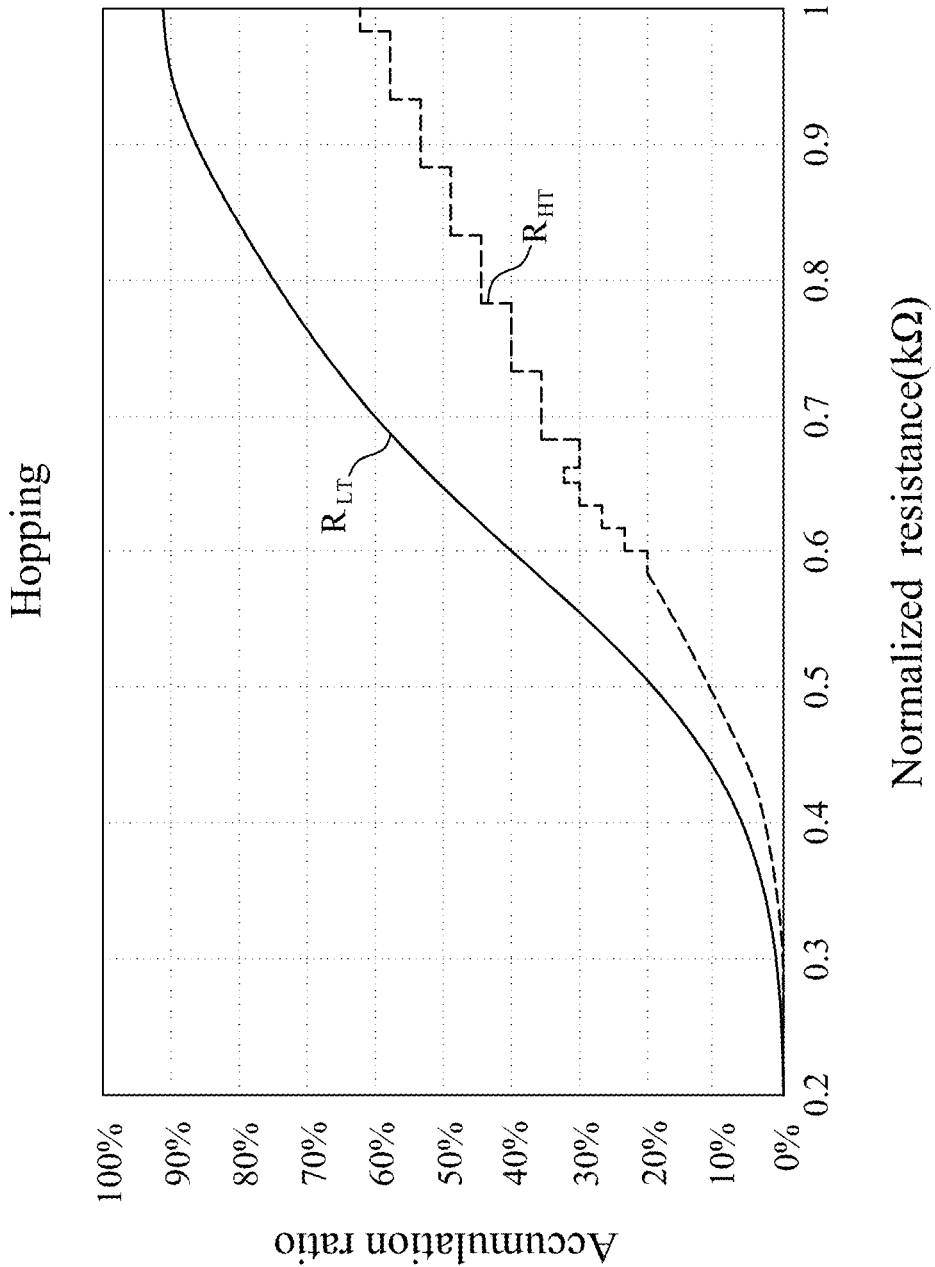
FIG. 4 illustrates a resistance distribution diagram, at a first and a second temperature, in hopping state of the programmable element in accordance with one embodiment of the present disclosure.
Figure 5:
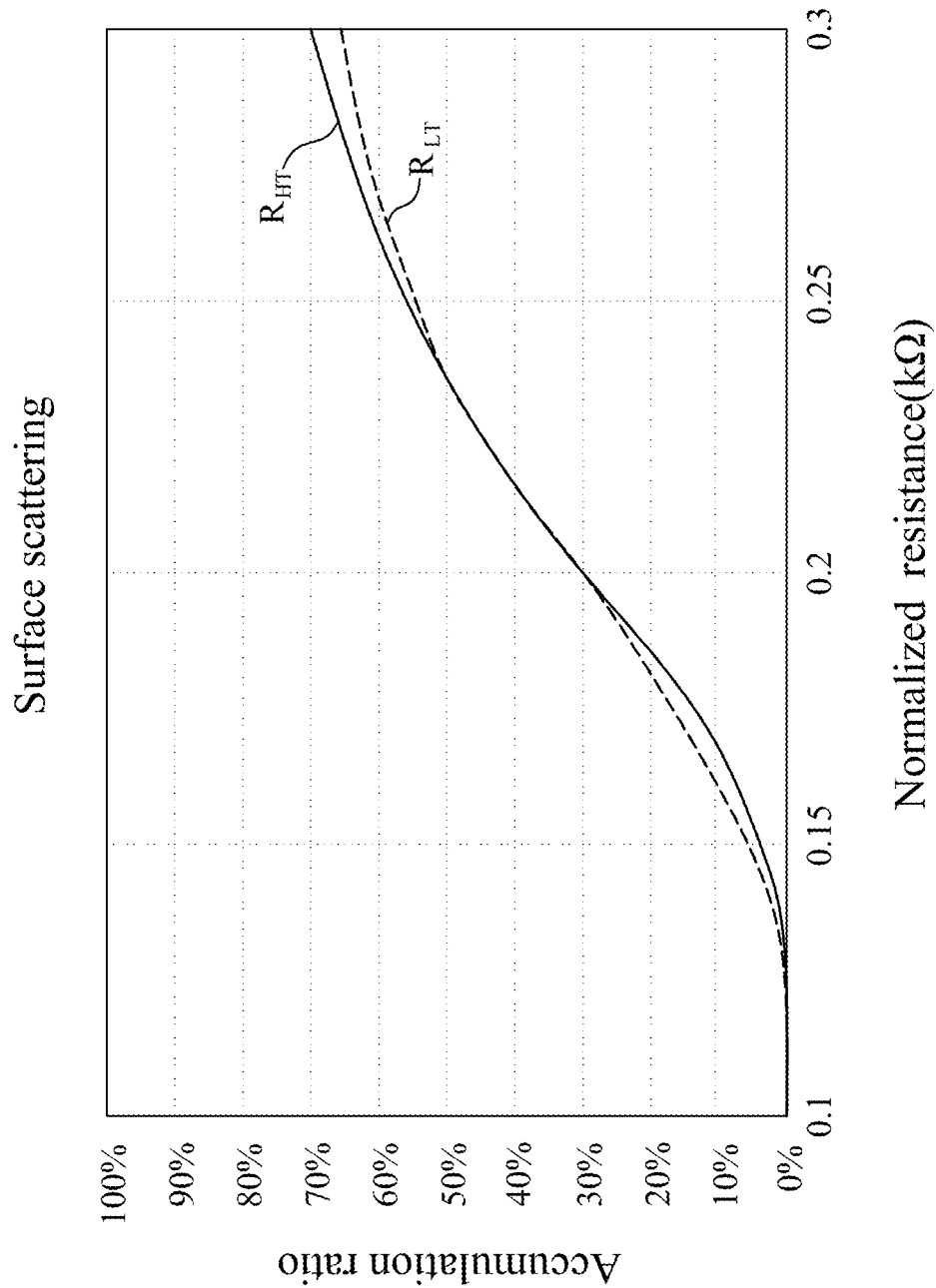
FIG. 5 illustrates a resistance distribution diagram, at the first and the second temperature, in surface scattering state of the programmable element in accordance with one embodiment of the present disclosure.
Figure 6:
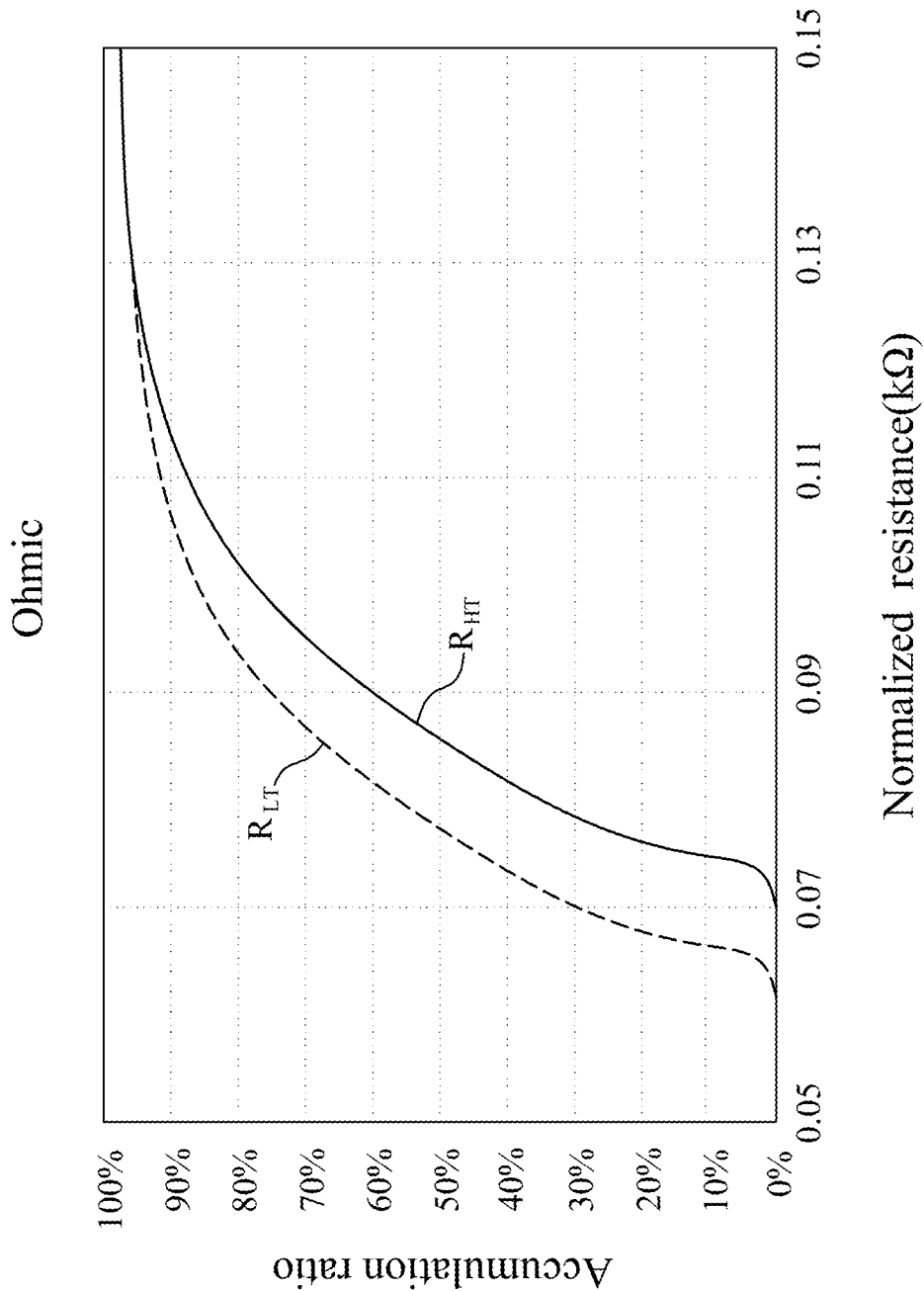
FIG. 6 illustrates a resistance distribution diagram, at the first and the second temperature, in ohmic state of the programmable element in accordance with one embodiment of the present disclosure.

FIG. 4 illustrates a resistance distribution diagram, at the first and the second temperature, in hopping state of the programmable element 201 in accordance with one embodiment of the present disclosure. FIG. 5 illustrates a resistance distribution diagram, at the first and the second temperature, in surface scattering state of the programmable element 201 in accordance with one embodiment of the present disclosure. FIG. 6 illustrates a resistance distribution diagram, at the first and the second temperature, in ohmic state of the programmable element 201 in accordance with one embodiment of the present disclosure.

With reference to FIG. 1 and FIGS. 4 to 6, at step S17, the first resistance $R_{LT}$ and the second resistance $R_{HT}$ may be compared to characterize a resistance state(s) of the programmable element(s) 201.

With reference to FIG. 4, while the first resistance $R_{LT}$ obtained at the first temperature is lower than the second resistance $R_{HT}$ obtained at the second temperature, the resistance state of the programmable element 201 is characterized as the hopping state.

With reference to FIG. 5, while the first resistance $R_{LT}$ obtained at the first temperature is about the same as the second resistance $R_{HT}$ obtained at the second temperature, the resistance state of the programmable element 201 is characterized as the surface scattering state.

With reference to FIG. 6, while the first resistance $R_{LT}$ obtained at the first temperature is greater than the second resistance $R_{HT}$ obtained at the second temperature, the resistance state of the programmable element 201 is characterized as the ohmic state.

As the resistance state of the programmable element 201 is critical to its electrical performance, the programmable element 201 characterized as the hopping state or the surface scattering state may have relatively poor electrical performance comparing to the programmable element characterized as the ohmic state.

The programmable element 201 characterized as the hopping state or the surface scattering state may need to be reprogrammed with a greater programming voltage or tuned the integrated circuit such as adjusting the first operation voltage for the protection transistor 301, the second operation voltage for the selection transistor 401, the device length of the protection transistor 301, or the device length of the selection transistor 401.

Due to the design of the method 10 in accordance with one embodiment of the present disclosure, the resistance state of the programmable element 201 can be characterized readily. Hence, the programmable elements 201 which are not meet the specification criteria (i.e., in hopping state or surface scattering state) can be easily screened out and according treatment can be immediately applied. As a result, the device fabrication time using the method 10 for characterization of the resistance state of the programmable element 201 may be shorted.

Figure 7:
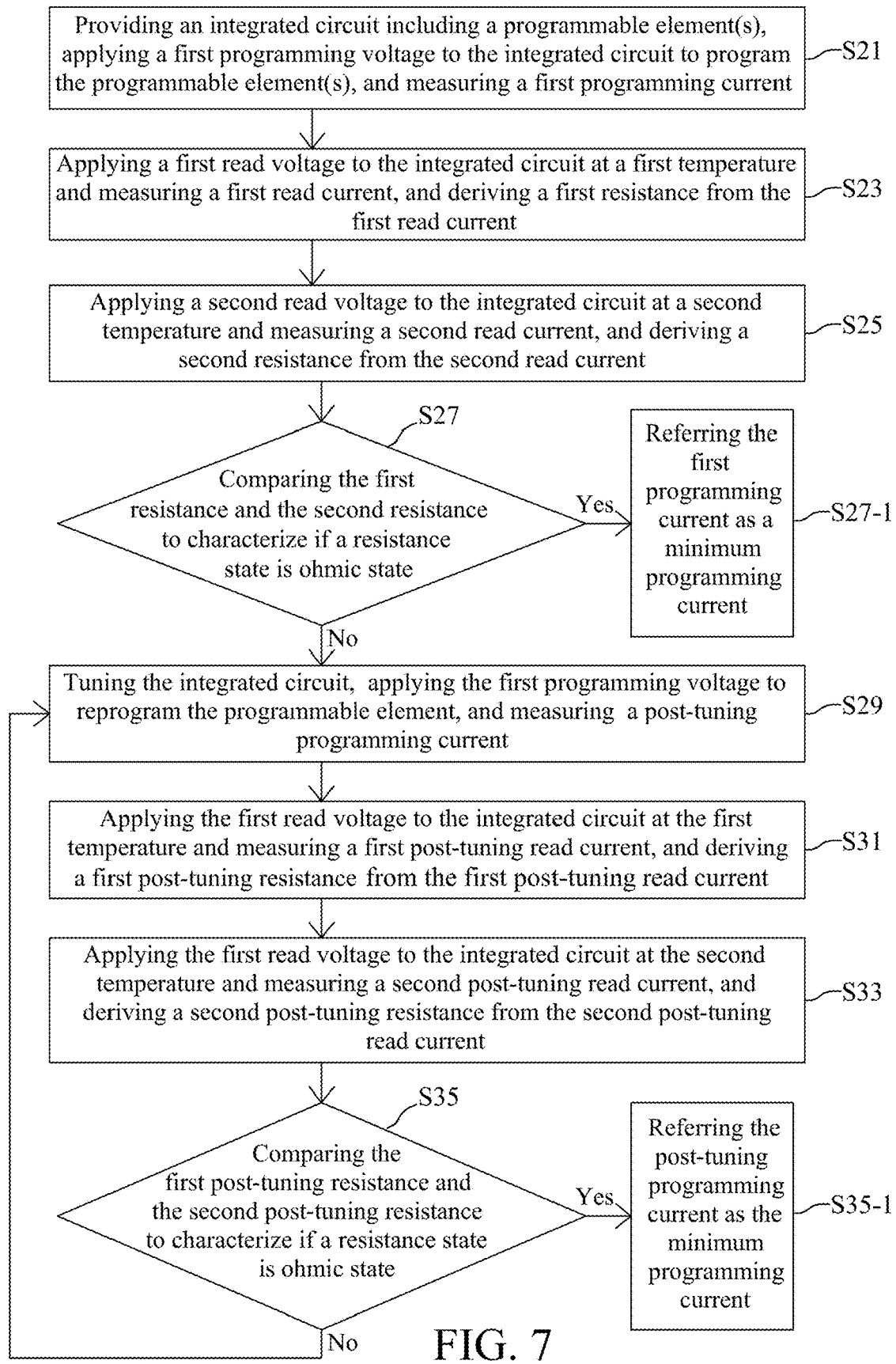
FIG. 7 illustrates, in a flowchart diagram form, a method for determining a minimum programming current of a programmable element of an integrated circuit in accordance with another embodiment of the present disclosure.

FIG. 7 illustrates, in a flowchart diagram form, a method 20 for determining a minimum programming current of a programmable element 201 of an integrated circuit in accordance with another embodiment of the present disclosure.

With reference to FIG. 7, at step S21, an integrated circuit including programmable elements 201 may be provided, a first programming voltage may be applied to the integrated circuit to program the programmable elements 201, and a first programming current may be obtained.

The integrated circuit may have a design similar to that illustrated at Step S11. The first programming voltage may be applied to the first terminal 101 to program the programmable elements 201. The programming procedure may be conducted at a temperature between about 90° C. and about 110° C. The protection transistor 301 and the selection transistor 401 may be turned on during the programming procedure. The first programming current may be measured during the programming procedure.

With reference to FIG. 7, at Step S23, a first read voltage may be applied to the integrated circuit at a first temperature and a first read current may be measured. A first resistance $R_{LT}$ may be derived from the first read current. The Step S23 may be conducted in a procedure similar to that illustrated at Step S13.

With reference to FIG. 7, at Step S25, a second read voltage may be applied to the integrated circuit at a second temperature and a second read current may be measured. A second resistance $R_{HT}$ may be derived from the second read current. The Step S25 may be conducted in a procedure similar to that illustrated at Step S15.

With reference to FIG. 7, at Step S27, the first resistance $R_{LT}$ and the second resistance $R_{HT}$ may be compared to characterize if a resistance state of the programmable element 201 is ohmic state. If the resistance state of the programmable element 201 is ohmic state, the first programming current may be referred to as the minimum programming current as at the Step 27-1. If the resistance state of the programmable element 201 is not ohmic state, proceed to the Step S29.

With reference to FIG. 7, at step S29, the integrated circuit may be fine-tuned, and the first programming voltage may be applied to the integrated circuit to reprogram the integrated circuit. A post-tuning programming current may be measured.

In some embodiments, the fine-tuning process of the integrated circuit may include adjusting the first operation voltage for the protection transistor 301, the second operation voltage for the selection transistor 401, the device length of the protection transistor 301, or the device length of the selection transistor 401. After the fine-tuning process of the integrated circuit, a reprogram procedure may be performed to the integrated circuit. Specifically, the first programming voltage may be applied to the first terminal 101 and the voltage node 103 may be set to ground potential. The post-tuning programming current may be measured during the reprogram procedure. During the reprogram procedure, the protection transistor 301 and the selection transistor 401 may be turned on. Voltages applied to the protection transistor 301 and the selection transistor 401 may be similar to that illustrated at the Step S21.

In some embodiments, the fine-tuning process of the integrated circuit may be omitted. The programmable element 201, which the resistance is not ohmic state, may be reprogramed by a greater programming voltage than that of the first programming voltage.

With reference to FIG. 7, at step S31, the first read voltage may be applied to the integrated circuit at the first temperature and a first post-tuning read current may be measured. A first post-tuning resistance $R'_{LT}$ may be derived from the first post-tuning read current. The Step S31 may be conducted in a procedure similar to that illustrated at the Step S23.

With reference to FIG. 7, at step S33, the first read voltage may be applied to the integrated circuit at the second temperature and a second post-tuning read current may be measured. A second post-tuning resistance $R'_{HT}$ may be derived from the second post-tuning read current. The Step S33 may be conducted in a procedure similar to that illustrated at the Step S25.

With reference to FIG. 7, at Step S35, the first post-tuning resistance $R'_{LT}$ and the second post-tuning resistance $R'_{HT}$ may be compared to characterize if a resistance state of the programmable element 201 is ohmic state. If the resistance state of the programmable element 201 is ohmic state, the post-tuning programming current may be referred to as the minimum programming current as at the Step 35-1. If the resistance state of the programmable element 201 is not ohmic state, the Steps S29 to the Step S35 may be repeated.

Figure 8:
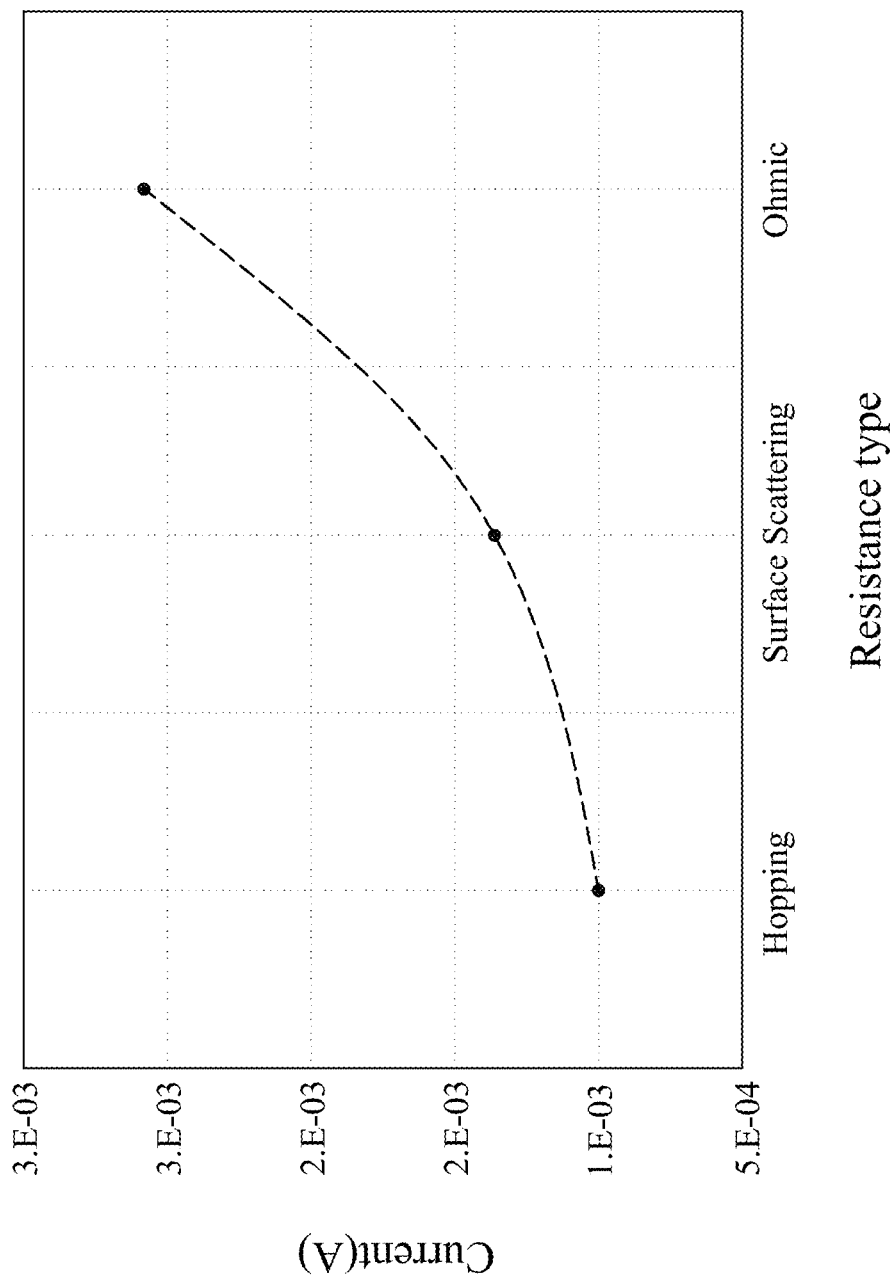
FIG. 8 is an exemplary data of programming currents of different resistance states in accordance with another embodiment of the present disclosure.

FIG. 8 is an exemplary data diagram of programming currents of different resistance states in accordance with one embodiment of the present disclosure.

The minimum programming current may be used as a specification criterion during a programming procedure to quickly check a resistance state of a programmable element. For example, during a programming procedure of another programmable element, if the programming current measured is less than the minimum programming current (e.g., 3E-03 A), the programmable element will be treated as a failure one and a reprogram procedure may be conducted directly. In contrast, if the programming current measured is greater than the minimum programming current, the programmable element will be treated as a success one which no further reprogram procedure is needed.

Figure 9:
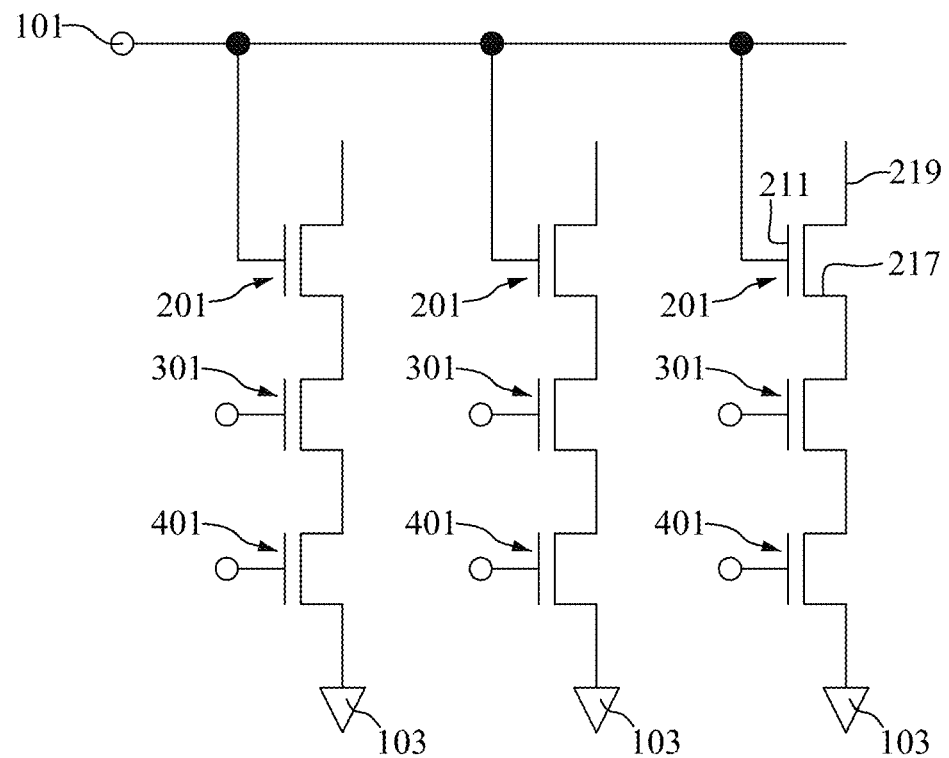
FIG. 9 illustrates, in a schematic circuit diagram, an integrated circuit in accordance with another embodiment of the present disclosure.
Figure 10:
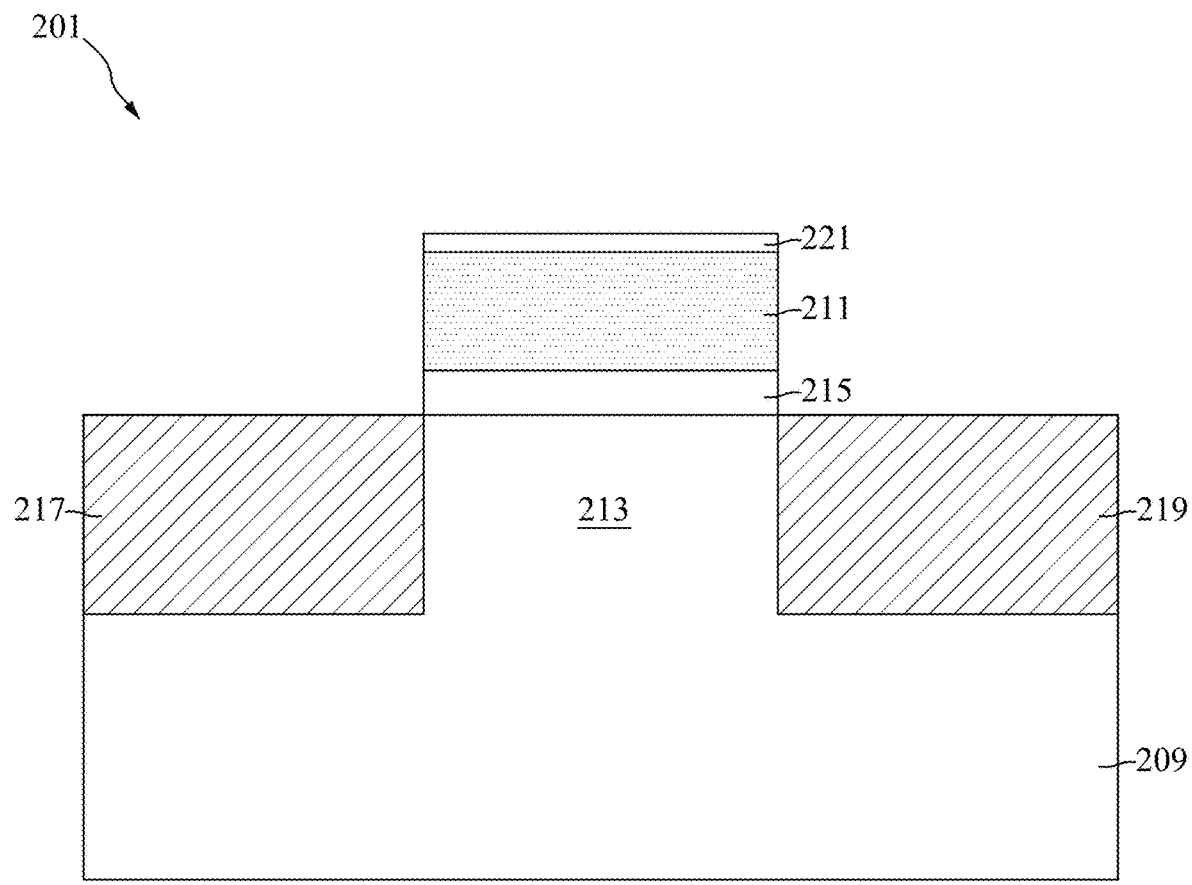
FIG. 10 illustrates, in a schematic cross-sectional view diagram, one of the programmable elements of the integrated circuit in accordance with another embodiment of the present disclosure.

FIG. 9 illustrates, in a schematic circuit diagram, an integrated circuit in accordance with another embodiment of the present disclosure. FIG. 10 illustrates, in a schematic cross-sectional view diagram, one of the programmable elements 201 of the integrated circuit in accordance with another embodiment of the present disclosure.

With reference to FIG. 9, the integrated circuit may have a design similar to that illustrated in FIG. 2. The same or similar elements in FIG. 9 as in FIG. 2 have been marked with similar reference numbers and duplicative descriptions have been omitted. The programmable elements 201 in FIG. 9 may have a transistor-like structure. For convenience of description, only one programmable element 201 is described. The first terminal 101 may be electrically coupled to a programming gate electrode 211 of the programmable element 201. The protection transistor 301 may be electrically coupled to a first impurity region 217 of the programmable element 201. In some embodiments, a second impurity region 219 of the programmable element 201 may be left floating and shown without a connection.

With reference to FIG. 10, the programmable element 201 may include the programming gate electrode 211, a first channel region 213, a first insulation layer 215, the first impurity region 217, and the second impurity region 219. The first insulation layer 215 may be disposed on a substrate 209. The programming gate electrode 211 may be disposed on the first insulation layer 215 and electrically coupled to the first terminal 101. The first channel region 213 may be a portion of the substrate 209 and may be opposite to the programming gate electrode 211 with the first insulation layer 215 interposed therebetween. The first impurity region 217 and the second impurity region 219 may be disposed in the substrate 209 and adjacent to two sides of the first insulation layer 215. That is, the first impurity region 217 and the second impurity region 219 may be adjacent to two sides of the first channel region 213.

The substrate 209 may include a semiconductor material, such as an elemental semiconductor including Si and Ge; a compound or alloy semiconductor including SiC, SiGe, GaAs, GaP, GaAsP, AlInAs, AlGaAs, GaInAs, InAs, GaInP, InP, InSb, or GaInAsP; or a combination thereof. The substrate 209 may be doped or undoped. The first impurity region 217 and the second impurity region 219 may have an opposite electrical type to the substrate 209. The first impurity region 217 and the second impurity region 219 may be doped with a dopant such as phosphorus, arsenic, antimony, or boron. The dopant concentration of the first insulation layer 215 and the first impurity region 217 may be between about 1E17 atoms/cm^3 and between about 1E18 atoms/cm^3.

The first insulation layer 215 may be formed of, for example, oxides, nitrides, oxynitrides, silicates (e.g., metal silicates), aluminates, titanates, nitrides, high-k materials, or any combination thereof. The high-k materials may have a k value greater than about 7.0 and may be a metal oxide or a silicate of Hf, Al, Zr, La, Mg, Ba, Ti, Pb, or a combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials may further include dopants such as, for example, lanthanum and aluminum. The first insulation layer 215 may have a thickness between about 15 angstroms and about 55 angstroms.

The programming gate electrode 211 may be formed of, for example, polycrystalline silicon, doped polycrystalline silicon, polycrystalline silicon germanium, doped polycrystalline silicon germanium, or a metallic material (e.g., titanium, tantalum, tungsten, copper, or aluminum). In some embodiments, a top conductive layer 221 may be disposed on the programming gate electrode 211. The top conductive layer 221 may be formed of, for example, titanium silicide, nickel silicide, nickel platinum silicide, tantalum silicide, or cobalt silicide.

The programming of the programmable element 201 in FIGS. 9 and 10 may be performed by the breakdown or rupture of the first insulation layer 215 of the programmable element 201. With the breakdown of the first insulation layer 215, a conducting path is formed through the first insulation layer 215 to form a programmed connection between the programming gate electrode 211 and the first channel region 213 or the first impurity region 217.

Figure 11:
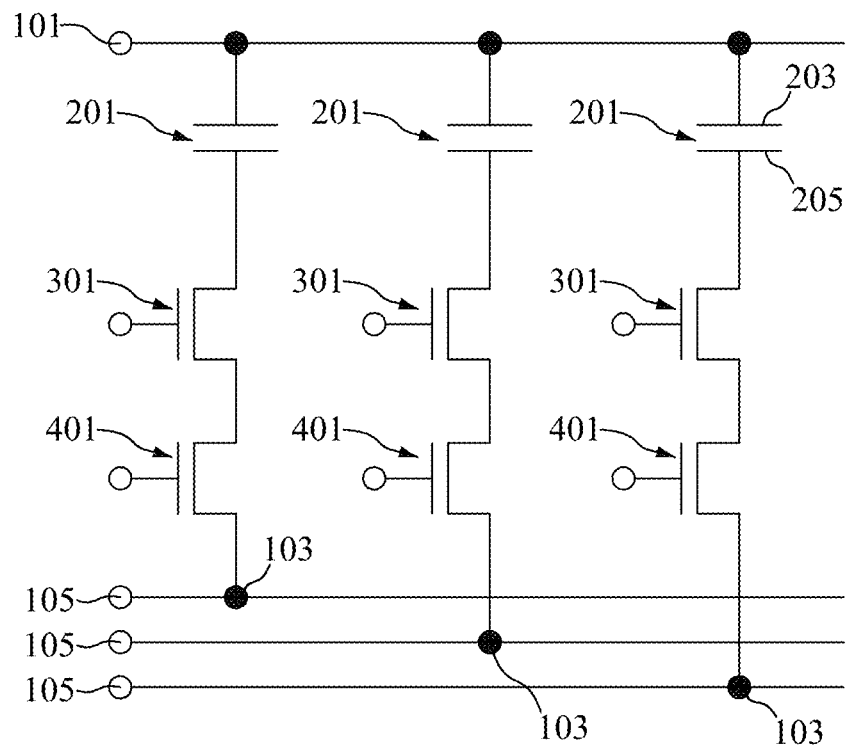
FIG. 11 illustrates, in a schematic circuit diagram, an integrated circuit in accordance with another embodiment of the present disclosure.

FIG. 11 illustrates, in a schematic circuit diagram, an integrated circuit in accordance with another embodiment of the present disclosure.

With reference to FIG. 11, the integrated circuit may have a design similar to that illustrated in FIG. 2. The same or similar elements in FIG. 9 as in FIG. 2 have been marked with similar reference numbers and duplicative descriptions have been omitted. The programmable elements 201 in FIG. 9 may have a transistor-like structure. The integrated circuit may include first conductive lines 105. The first conductive lines 105 may be electrically coupled to a corresponding one of the voltage nodes 103.

For convenience of description, only one first conductive line 105 is described. A first bias voltage of a second polarity may be applied to the first conductive line 105. The second polarity may be negative with respect to the ground potential. The first bias voltage may be, for example, between about −0.5 volts and −2.5 volts, between about −1.0 volts and −2.5 volts, between about −1.0 volt and about −2.0 volts, or between about −1.0 volts and about −1.5 volts. With the first bias voltage, the programming voltage applied to the first terminal 101 may need not be as high as the programming voltage mentioned at the Step S11. In addition, the channel resistance of the selection transistor 401 may be reduced. Furthermore, the programming current may be increased due to a higher effective programming voltage and lower impedance path. As a result, the duration for the first read procedure and the second read procedure may be shortened.

In some embodiments, the first operation voltage applied to the protection transistor 301 and the second operation voltage applied to the selection transistor 401 may be reduced with the presence of the first bias voltage. As a result, the power consumption of the integrated circuit may be reduced.

Although the programmable element 201 is illustrated as being capacitor-like structure in FIG. 11 but is not limited thereto. The programmable element 201 may be of the transistor-like structure as well.

Figure 12:
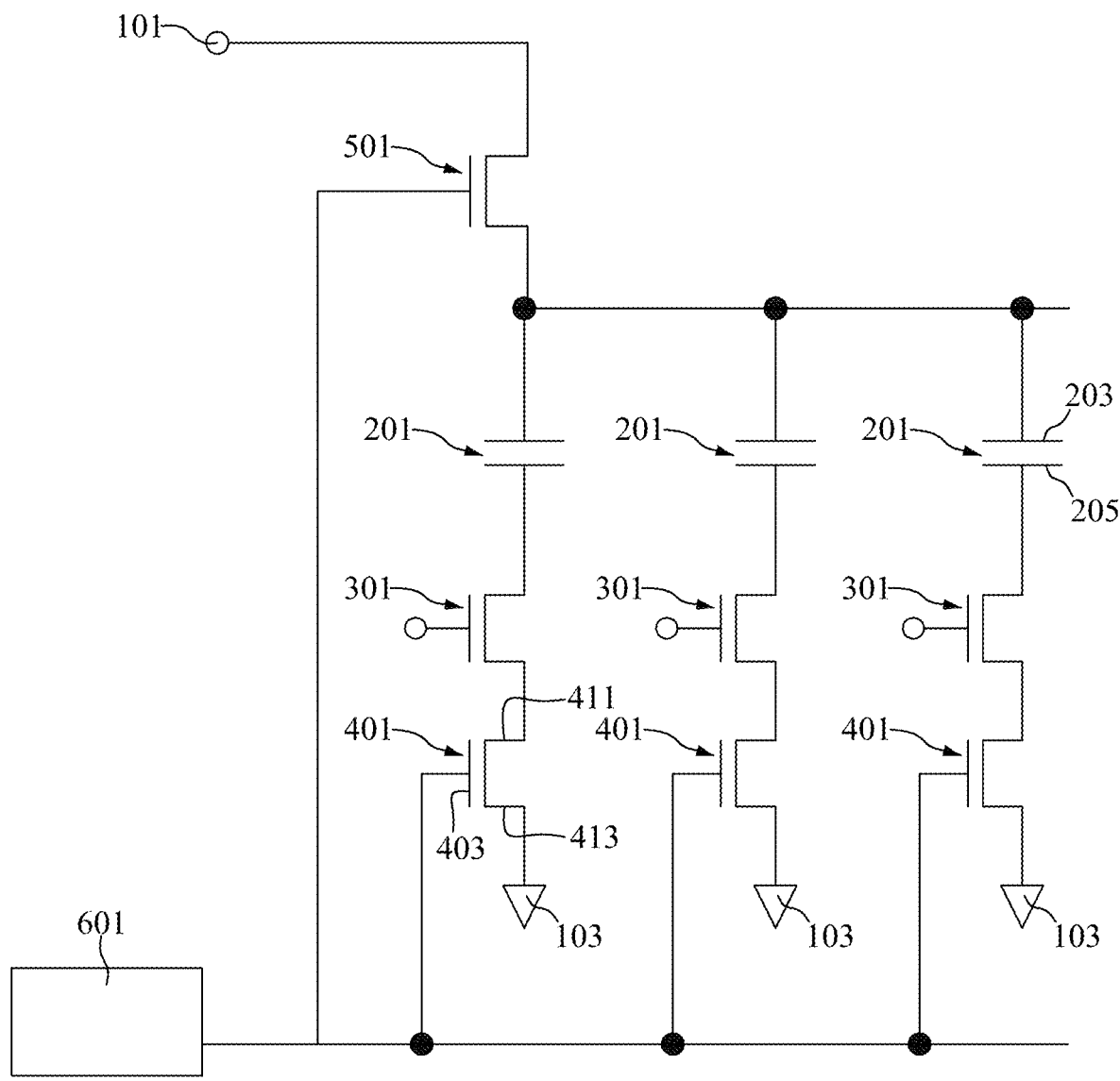
FIG. 12 illustrates, in a schematic circuit diagram, an integrated circuit in accordance with another embodiment of the present disclosure.
Figure 13:
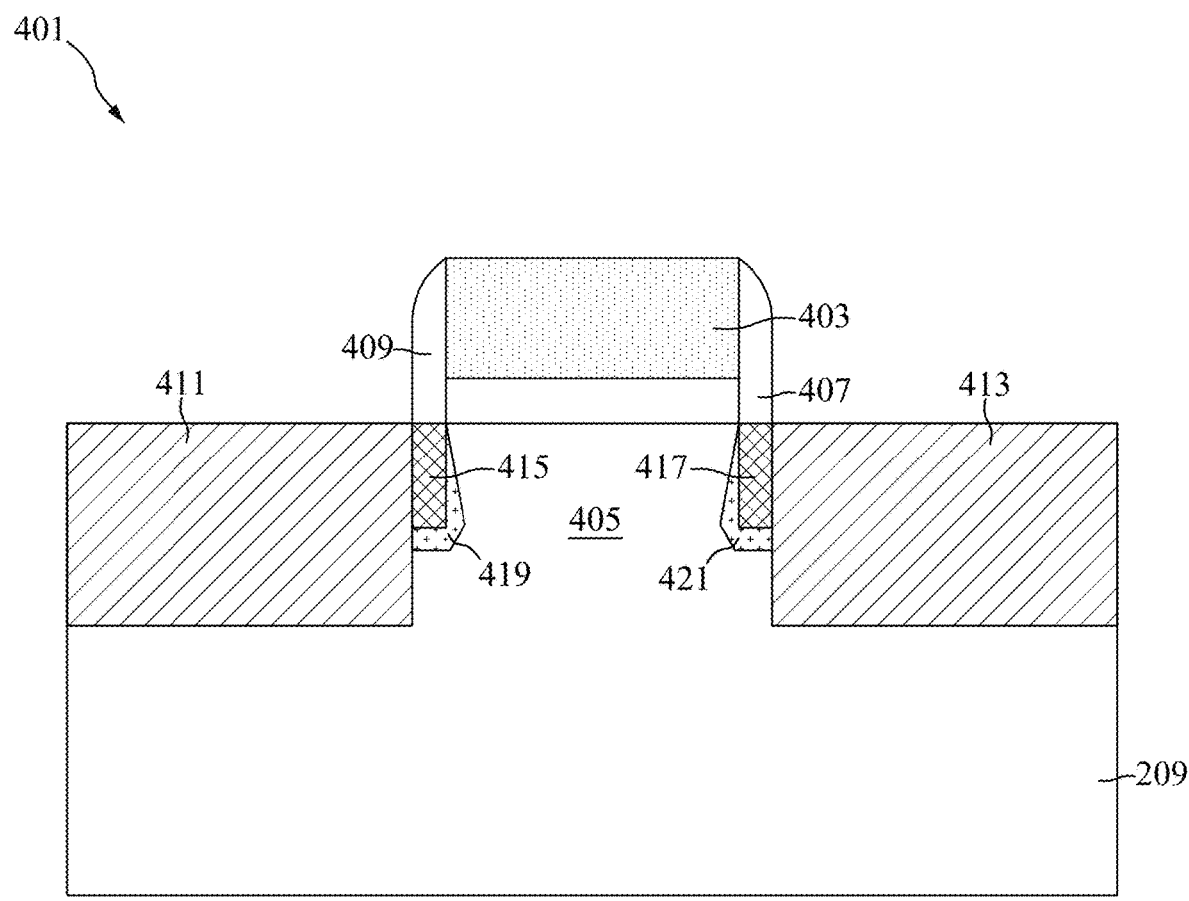
FIG. 13 illustrates, in a schematic cross-sectional view diagram, one of the selection transistors of the integrated circuit in accordance with another embodiment of the present disclosure.

FIG. 12 illustrates, in a schematic circuit diagram, an integrated circuit in accordance with another embodiment of the present disclosure. FIG. 13 illustrates, in a schematic cross-sectional view diagram, one of the selection transistors 401 of the integrated circuit in accordance with another embodiment of the present disclosure.

With reference to FIG. 11, the integrated circuit may have a design similar to that illustrated in FIG. 2. The same or similar elements in FIG. 9 as in FIG. 2 have been marked with similar reference numbers and duplicative descriptions have been omitted. The integrated circuit may further include a blocking transistor 501 and control logic unit 601. The protection transistors 301 and the selection transistors 401 may be, for example, n-type transistors but are not limited thereto.

The blocking transistor 501 may be, for example, a p-type transistor but is not limited thereto. The blocking transistor 501 may be coupled between the first terminal 101 and the programmable elements 201 for selectively applying the programming voltage to a programmable element 201 selected for programming by its associated selection transistor 401. Generally, the blocking transistor 501 may be provided for isolating the programmable elements 201 from a programming voltage at the first terminal 101 between program procedures.

The control logic unit 601 may be provided for generating various select signals for programming the programmable elements 201. For example, a programming voltage may be applied to the first terminal 101, and the blocking transistor 501 may be selected by asserting the select signal. The corresponding selection transistor 401 may be enabled by asserting the select signal to select the corresponding programmable element 201 to be programmed.

Specifically, the blocking transistor 501 may be controlled to block the selection transistor 401 from the first terminal 101 after a programming procedure, thereby isolating the selection transistor 401 from the programming voltage to allow the selection transistor 401 to exit from a snapback mode, which will be illustrated later, without requiring the cycling of the programming voltage. In this manner, a programming procedure that programs multiple programmable elements 201 may be conducted by cycling the blocking transistor 501, not by cycling the programming voltage, thereby reducing the time required for the programming procedure.

In the programming procedure, the blocking transistor 501 and selection transistor 401 may be designed such that the selection transistor 401 may enter the snapback mode of operation after the initial rupture of the programmable element 201, while the blocking transistor 501 may remain in a normal mode of operation. This situation may be achieved by tailoring the breakdown voltage of the selection transistor 401. For example, if the programming voltage associated with the programmable element 201 is about +5.0 volts, the breakdown voltage of the selection transistor 401 may be between about +4.0 volts and about +4.5 volts.

In the snapback mode of operation, the selection transistor 401 may exhibit increased current conduction with a given applied voltage, as compared to a transistor operating in the normal mode below the breakdown voltage. Generally, this increased current conduction mode may allow the selection transistor 401 to conduct sufficient soak current to perfect the programming of the programmable element 201 without requiring an increased device size. Hence, the area of the integrated circuit may be reduced.

With reference to FIG. 13, the selection transistor 401 may include a selection gate electrode 403, a second channel region 405, a second insulation layer 407, selection gate spacers 409, a third impurity region 411, a fourth impurity region 413, a first light-impurity region 415, a second light-impurity region 417, a first halo-impurity region 419, and a second halo-impurity region 421.

With reference to FIG. 13, the second insulation layer 407 may be disposed on the substrate 209. The second insulation layer 407 may be formed of a material similar to the first insulation layer 215 illustrated in FIG. 10. The selection gate electrode 403 may be disposed on the second insulation layer 407 and may be electrically coupled to the control logic unit 601. The selection gate electrode 403 may be formed of a material similar to the programming gate electrode 211 illustrated in FIG. 10. The selection gate spacers 409 may be disposed on sidewalls of the selection gate electrode 403 and the second insulation layer 407. The second channel region 405 may be a portion of the substrate 209 and may be opposite to the selection gate electrode 403 with the second insulation layer 407 interposed therebetween.

The third impurity region 411 and the fourth impurity region 413 may be disposed in the substrate 209 and adjacent to two sides of the second insulation layer 407. That is, the third impurity region 411 and the fourth impurity region 413 may be adjacent to two sides of the second channel region 405. The profile of the third impurity region 411 and the fourth impurity region 413 may be tailored by the selection gate spacers 409. The third impurity region 411 may be electrically coupled to the protection transistor 301 and the fourth impurity region 413 may be electrically coupled to the voltage node 103. The third impurity region 411 and the fourth impurity region 413 may be doped with a dopant such as phosphorus, arsenic, antimony, or boron.

The first light-impurity region 415 and the second light-impurity region 417 may be respectively correspondingly disposed under the selection gate spacers 409 and adjacent to the third impurity region 411 and the fourth impurity region 413. The second channel region 405 may be disposed between the first light-impurity region 415 and the second light-impurity region 417. The first light-impurity region 415 and the second light-impurity region 417 may be doped with a dopant such as phosphorus, arsenic, antimony, or boron. The third impurity region 411, the fourth impurity region 413, the first light-impurity region 415, and the second light-impurity region 417 may have a same electrical type. The dopant concentration of the first light-impurity region 415 and the second light-impurity region 417 may be less than that of the third impurity region 411 and the fourth impurity region 413.

The first halo-impurity region 419 and the second halo-impurity region 421 may be respectively correspondingly disposed adjacent to the first light-impurity region 415 and the second light-impurity region 417. The first halo-impurity region 419 and the second halo-impurity region 421 may be doped with a dopant such as phosphorus, arsenic, antimony, or boron. The first halo-impurity region 419 and the second halo-impurity region 421 may have different electrical type from the first light-impurity region 415 and the second light-impurity region 417 to provide a sharp n+/p− sub-junction. The sharp n+/p− sub-junction design may decrease the breakdown voltage of the selection transistor 401.

Although the programmable element 201 is illustrated as being capacitor-like structure in FIG. 12 but is not limited thereto. The programmable element 201 may be of the transistor-like structure as well.

One aspect of the present disclosure provides a method for characterizing a resistance state of a programmable element of an integrated circuit, including the step of setting a first programming voltage of a first polarity to program the programmable element of the integrated circuit, setting a first read voltage of the first polarity to the integrated circuit at a first temperature to obtain a first read current, and a first resistance is derived from the first read current, setting the first read voltage of the first polarity to the integrated circuit at a second temperature to obtain a second read current, the second temperature is at least 50° C. higher than the first temperature, and a second resistance is derived from the second read current, and comparing the first resistance and the second resistance to characterize the resistance state of the programmable element.

Another aspect of the present disclosure provides a method for determining a minimum programming current of programming a programmable element of an integrated circuit, including the step of setting a first programming voltage to program the programmable element of the integrated circuit device and obtain a first programming current, setting a first read voltage to the integrated circuit at a first temperature to obtain a first read current, and a first resistance is derived from the first read current, setting the first read voltage to the integrated circuit at a second temperature to obtain a second read current, the second temperature is at least 50° C. higher than the first temperature, and a second resistance is derived from the second read current, comparing the first resistance and the second resistance to characterize a resistance state of the programmable element is ohmic state, and referring the first programming current as the minimum programming current.

Another aspect of the present disclosure provides a method for determining a minimum programming current of programming a programmable element of an integrated circuit, including the step of setting a first programming voltage to program the programmable element of the integrated circuit device and obtain a first programming current, setting a first read voltage to the integrated circuit at a first temperature to obtain a first read current, and a first resistance is derived from the first read current, setting the first read voltage to the integrated circuit at a second temperature to obtain a second read current, the second temperature is at least 50° C. higher than the first temperature, and a second resistance is derived from the second read current, comparing the first resistance and the second resistance to characterize a resistance state of the programmable element is hopping state or surface scattering state, tuning the integrated circuit and setting the first programming voltage to reprogram the programmable element to obtain a post-tuning programming current, setting the first read voltage to the integrated circuit at the first temperature to obtain a first post-tuning read current, and a first post-tuning resistance is derived from the first post-tuning read current, setting the first read voltage to the integrated circuit at the second temperature to obtain a second post-tuning read current, and a second post-tuning resistance is derived from the second post-tuning read current, comparing the first post-tuning resistance and the second post-tuning resistance to characterize the resistance state of the programmable element is ohmic state, referring the post-tuning programming current as the minimum programming current, and repeating the step of tuning the integrated circuit and setting the first programming voltage to the step of comparing the first post-tuning resistance and the second post-tuning resistance if the resistance state of the programmable element is characterized as hopping state or surface scattering state at the step of comparing the first post-tuning resistance and the second post-tuning resistance.

Due to the design of the method 10 in accordance with one embodiment of the present disclosure, the resistance state of the programmable element 201 can be characterized readily. Hence, the programmable elements 201 which are not meet the specification criteria (i.e., in hopping state or surface scattering state) can be easily screened out and according treatment can be immediately applied. As a result, the device fabrication time using the method 10 for characterization of the resistance state of the programmable element 201 may be shorted.

Although the present disclosure and its advantages have been described in detail, it should be understood that various changes, substitutions, and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for characterizing a resistance state of a programmable element of an integrated circuit, comprising the step of:
    setting a first programming voltage of a first polarity to program the programmable element of the integrated circuit;
    setting a first read voltage of the first polarity to the integrated circuit at a first temperature to obtain a first read current, and a first resistance is derived from the first read current;
    setting the first read voltage of the first polarity to the integrated circuit at a second temperature to obtain a second read current, the second temperature is at least 50° C. higher than the first temperature, and a second resistance is derived from the second read current; and
    comparing the first resistance and the second resistance to characterize the resistance state of the programmable element.

2. The method of claim 1, wherein the first temperature is between about 0° C. and about 40° C.

3. The method of claim 1, wherein the second temperature is between about 90° C. and 110° C.

4. The method of claim 1, wherein the step of setting the first programming voltage of the first polarity to program the programmable element of the integrated circuit is conducted at a temperature between about 90° C. and 110° C.

5. The method of claim 1, wherein the first polarity is positive with respect to ground potential.

6. The method of claim 1, wherein the programmable element is electrically coupled between a first terminal and a voltage node of the integrated circuit and the first programming voltage is applied to the first terminal.

7. The method of claim 6, wherein the voltage node comprises ground potential.

8. The method of claim 7, wherein the integrated circuit comprises a protection transistor electrically coupled between the programmable element and the voltage node.

9. The method of claim 8, wherein the integrated circuit comprises a selection transistor electrically coupled between the protection transistor and the voltage node.

10. The method of claim 7, wherein the programmable element comprises a top electrode electrically coupled to the first terminal and a bottom electrode electrically coupled to the voltage node and separated from the top electrode by a middle insulation layer.

11. The method of claim 7, wherein the programmable element comprises a programming gate electrode electrically coupled to the first terminal, a first channel region separated from the programming gate electrode by a first insulation layer, and a first impurity region and a second impurity region respectively adjoined to two sides of the first channel region, and the first impurity region is electrically coupled to the voltage node.

12. The method of claim 11, wherein the second impurity region is electrically float.

13. The method of claim 6, wherein the integrated circuit comprises a first conductive line electrically coupled to the voltage node and a first bias voltage of a second polarity is applied to the first conductive line.

14. The method of claim 13, wherein the second polarity is negative with respect to ground potential.

15. The method of claim 13, wherein the first bias voltage is between about −1.0 volts and about −2.0 volts.

16. The method of claim 6, wherein the programming voltage is between about +5.0 volts and about +10.0 volts.

17. The method of claim 9, wherein the selection transistor comprises a third impurity region electrically coupled to the protection transistor, a fourth impurity region electrically coupled to the voltage node and separated from the third impurity region by a second channel region, a selection gate electrode over the second channel region with a second insulation layer interposed therebetween.

18. The method of claim 17, wherein the selection transistor comprises a first light-impurity region adjacent to the third impurity region and a second light-impurity region adjacent to the fourth impurity region and the second channel region is between the first light-impurity region and the second light-impurity region.

19. A method for determining a minimum programming current of programming a programmable element of an integrated circuit, comprising the step of:

setting a first programming voltage to program the programmable element of the integrated circuit device and obtain a first programming current;

setting a first read voltage to the integrated circuit at a first temperature to obtain a first read current, and a first resistance is derived from the first read current;

(c) setting the first read voltage to the integrated circuit at a second temperature to obtain a second read current, the second temperature is at least 50° C. higher than the first temperature, and a second resistance is derived from the second read current;

comparing the first resistance and the second resistance to characterize a resistance state of the programmable element is ohmic state; and referring the first programming current as the minimum programming current.

20. A method for determining a minimum programming current of programming a programmable element of an integrated circuit, comprising the step of:

setting a first programming voltage to program the programmable element of the integrated circuit device and obtain a first programming current;

setting a first read voltage to the integrated circuit at a first temperature to obtain a first read current, and a first resistance is derived from the first read current;

setting the first read voltage to the integrated circuit at a second temperature to obtain a second read current, the second temperature is at least 50° C. higher than the first temperature, and a second resistance is derived from the second read current;

comparing the first resistance and the second resistance to characterize a resistance state of the programmable element is hopping state or surface scattering state;

tuning the integrated circuit and setting the first programming voltage to reprogram the programmable element to obtain a post-tuning programming current;

setting the first read voltage to the integrated circuit at the first temperature to obtain a first post-tuning read current, and a first post-tuning resistance is derived from the first post-tuning read current;

setting the first read voltage to the integrated circuit at the second temperature to obtain a second post-tuning read current, and a second post-tuning resistance is derived from the second post-tuning read current;

comparing the first post-tuning resistance and the second post-tuning resistance to characterize the resistance state of the programmable element is ohmic state;

referring the post-tuning programming current as the minimum programming current; and repeating the step of tuning the integrated circuit and setting the first programming voltage to the step of comparing the first post-tuning resistance and the second post-tuning resistance if the resistance state of the programmable element is characterized as hopping state or surface scattering state at the step of comparing the first post-tuning resistance and the second post-tuning resistance.

* * * * *